US012354852B2

(12) United States Patent
Ko et al.

(10) Patent No.: US 12,354,852 B2
(45) Date of Patent: Jul. 8, 2025

(54) ELECTROSTATIC CHUCK, SUBSTRATE PROCESSING APPARATUS, AND SUBSTRATE PROCESSING METHOD

(71) Applicant: SEMES CO., LTD., Cheonan-si (KR)

(72) Inventors: Hyun Tak Ko, Jeju-si (KR); Sang Kee Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 498 days.

(21) Appl. No.: 17/318,727

(22) Filed: May 12, 2021

(65) Prior Publication Data
US 2021/0358726 A1 Nov. 18, 2021

(30) Foreign Application Priority Data
May 15, 2020 (KR) .................. 10-2020-0058285

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01J 37/32642* (2013.01); *H01L 21/67103* (2013.01); *H01L 21/6833* (2013.01); *H01J 2237/002* (2013.01); *H01J 2237/007* (2013.01); *H01J 2237/334* (2013.01); *H01L 21/67069* (2013.01)

(58) Field of Classification Search
USPC ...................................... 156/345.53; 118/728
See application file for complete search history.

(56) References Cited

U.S. PATENT DOCUMENTS

| | | | |
|---|---|---|---|
| 5,870,271 | A | 2/1999 | Herchen |
| 7,033,444 | B1 * | 4/2006 | Komino ................. C23C 16/46 |
| | | | 118/724 |
| 9,438,140 | B2 | 9/2016 | Takasaki et al. |
| 10,950,417 | B2 | 3/2021 | Tsuda et al. |
| 11,404,251 | B2 | 8/2022 | Yamaguchi et al. |
| 2002/0014894 | A1 | 2/2002 | Yonezawa |
| 2014/0116622 | A1 | 5/2014 | Lee |
| 2017/0278737 | A1 * | 9/2017 | Koiwa ............... H01L 21/6833 |
| 2018/0218886 | A1 * | 8/2018 | Yamaguchi ....... H01L 21/67069 |
| 2020/0135526 | A1 | 4/2020 | Takahashi |

FOREIGN PATENT DOCUMENTS

| | | |
|---|---|---|
| JP | 10-321711 | 12/1998 |
| JP | 2001068538 | 3/2001 |
| JP | 2002-043381 | 2/2002 |
| JP | 2003-249541 | 9/2003 |
| JP | 2006190805 | 7/2006 |
| JP | 2013-232642 | 11/2013 |

(Continued)

*Primary Examiner* — Ram N Kackar

(57) ABSTRACT

The present disclosure provides an electrostatic chuck, in which a heat transfer layer using a heat transfer fluid is disposed between a chuck main body disposed at an upper side of the electrostatic chuck and a chuck base disposed at a lower side of the electrostatic chuck, and the chuck main body is simply placed on the chuck base so as to be physically in contact with the heat transfer layer, such that heat may be stably transferred without damage even in a condition in which the heat transfer layer is at a high temperature, and the chuck main body may be easily separated from the chuck base for maintenance.

17 Claims, 11 Drawing Sheets

(56) References Cited

FOREIGN PATENT DOCUMENTS

| | | |
|---|---|---|
| JP | 3201051 | 8/2015 |
| JP | 2018125463 | 8/2018 |
| JP | 2020021958 | 2/2020 |
| KR | 10-2018-0069991 | 6/2018 |
| WO | 2019208191 | 10/2019 |

* cited by examiner

ELECTROSTATIC CHUCK, SUBSTRATE PROCESSING APPARATUS, AND SUBSTRATE PROCESSING METHOD

CROSS-REFERENCE TO RELATED APPLICATIONS

This application claims the priority of Korean Patent Application No. 10-2020-0058285 filed on May 15, 2020, in the Korean Intellectual Property Office, the disclosure of which is herein incorporated by reference.

BACKGROUND

Field

An embodiment of the present disclosure relates to an electrostatic chuck (ESC) used to retain a substrate such as a wafer, a substrate processing apparatus including the electrostatic chuck, and a substrate processing method using the substrate processing apparatus.

Description of the Related Art

An electrostatic chuck is widely used to fix a position of a substrate during substrate processing such as an etching process for manufacturing a semiconductor or the like.

In general, the electrostatic chuck includes a chuck main body disposed at an upper side of the electrostatic chuck and configured to attach a substrate with an electrostatic force, a chuck base disposed at a lower side of the electrostatic chuck and configured to support the chuck main body, and a bonding layer disposed between the chuck main body and the chuck base. The chuck main body and the chuck base are coupled to each other by means of the bonding layer. The bonding layer is made of silicone.

Because the material property of the bonding layer, the bonding layer of the electrostatic chuck is damaged at a temperature of about 150° C. or higher. For this reason, there is a problem in that heat transfer efficiency deteriorates or the electrostatic chuck cannot be used under a high-temperature condition.

In addition, because the chuck main body is coupled to the chuck base, there is a problem in that it is difficult to separate the chuck main body from the chuck base and thus it is difficult to perform maintenance.

DOCUMENT OF RELATED ART

Patent Documents (Patent Document 0001) Korean Patent No. 10-1430745 (Sep. 23, 2014)
(Patent Document 0002) Korean Patent Application Laid-Open No. 10-2016-0148093 (Dec. 26, 2016)

SUMMARY

The present disclosure has been made in an effort to provide an electrostatic chuck capable of being stably used under a high-temperature condition and a substrate processing apparatus including the same.

The present disclosure has also been made in an effort to provide an electrostatic chuck capable of being advantageously maintained and managed and a substrate processing apparatus including the same.

Technical problems to be solved by the present disclosure are not limited to the above-mentioned technical problems, and other technical problems, which are not mentioned above, may be clearly understood by those skilled in the art from the following descriptions.

In one aspect, the present disclosure provides an electrostatic chuck including: a chuck main body disposed at an upper side of the electrostatic chuck and configured to chuck a substrate with an electrostatic force; a chuck base disposed at a lower side of the electrostatic chuck and configured to adjust a temperature of the chuck main body; and a heat transfer layer disposed between the chuck main body and the chuck base and configured to use a heat transfer fluid.

The heat transfer layer may provide a heat transfer space disposed between the chuck main body and the chuck base and configured to accommodate the heat transfer fluid.

The heat transfer layer may include an annular outer seal interposed in an outer region between the chuck main body and the chuck base, such that a gap is formed between the chuck main body and the chuck base, and the heat transfer space is defined by the chuck main body, the chuck base, and the outer seal.

The outer seal may have a hollow portion communicating with the heat transfer space, and the heat transfer fluid may be introduced into the hollow portion.

The outer seal may comprise a heat resistance material.

The electrostatic chuck according to the embodiment of the present disclosure may further include a seal protection member configured to cover the outer seal.

A heat transfer fluid supply line may be connected to the heat transfer space. A heat transfer fluid return line may be connected to the heat transfer space.

In another aspect, the present disclosure provides an electrostatic chuck including: a chuck main body disposed at an upper side of the electrostatic chuck and configured to chuck a substrate with an electrostatic force; a chuck base disposed at a lower side of the electrostatic chuck and configured to adjust a temperature of the chuck main body; and a heat transfer layer disposed between the chuck main body and the chuck base and configured to use a heat transfer fluid, in which the chuck main body is placed on the chuck base so as to be physically in contact with the heat transfer layer. Specifically, the chuck main body may be placed on the chuck base only by its weight and be physically in contact with the heat transfer layer disposed between the chuck main body and the chuck base. The heat transfer layer may be provided on an upper portion of the chuck base.

In the state in which the chuck main body is placed on the chuck base only by its weight and is physically in contact with the heat transfer layer, an insert may be provided on a lower portion of the chuck main body and may extend downward, the chuck base may have a position fitting space into which the insert is inserted, and the heat transfer layer may have a through space through which the insert passes. The insert may have a cavity into which a power line is introduced.

In this case, the heat transfer layer may include an annular inner seal and an annular outer seal interposed between the chuck main body and the chuck base and disposed in an inner region relatively close to a periphery of the through space and an outer region relatively distant from the periphery of the through space, respectively, such that a gap is formed between the chuck main body and the chuck base, and a heat transfer space for accommodating the heat transfer fluid is defined by the chuck main body, the chuck base, the inner seal, and the outer seal.

The electrostatic chuck according to the embodiment of the present disclosure may further include a chuck pressing unit configured to maintain a state in which the chuck base and the chuck main body placed on the chuck base only by its weight are in close contact with the heat transfer layer.

The electrostatic chuck according to the embodiment of the present disclosure may further include a chuck lifting unit configured to move the chuck main body, which is placed only by its weight, in an upward/downward direction with respect to the chuck base. The chuck lifting unit may move the chuck main body downward, such that the chuck main body is in close contact with the heat transfer layer.

The chuck base may include at least any one of a heating element and a cooling element.

The heat transfer fluid may be an inert gas. The inert gas may be helium.

In still another aspect, the present disclosure provides a substrate processing apparatus including: a process chamber configured to provide a substrate processing space; and an electrostatic chuck disposed in the substrate processing space, in which the electrostatic chuck includes: a chuck main body disposed at an upper side of the electrostatic chuck and configured to chuck a substrate with an electrostatic force; a chuck base disposed at a lower side of the electrostatic chuck and configured to adjust a temperature of the chuck main body; and a heat transfer layer disposed between the chuck main body and the chuck base and configured to use a heat transfer fluid.

In the substrate processing apparatus according to the embodiment of the present disclosure, the chuck main body may be placed on the chuck base only by its weight and be physically in contact with the heat transfer layer disposed between the chuck main body and the chuck base.

In the state in which the chuck main body is placed on the chuck base only by its weight, an insert may be provided on a lower portion of the chuck main body and may extend downward, and the chuck base may have a position fitting space into which the insert is inserted while penetrating the heat transfer layer.

In addition, the electrostatic chuck according to the embodiment of the present disclosure may further include a chuck pressing unit configured to maintain a state in which the chuck main body and the chuck base are in close contact with the heat transfer layer.

In this case, the position fitting space may be provided in the form of a hole penetrating the chuck base in the upward/downward direction, and the insert may have a length that passes through the position fitting space. Further, the chuck pressing unit may further include an auxiliary plate disposed below the chuck base and connected to a lower portion of the insert, and a pressing force generating device configured to apply a downward force to the auxiliary plate.

Meanwhile, the substrate processing apparatus according to the embodiment of the present disclosure may further include, instead of the chuck pressing unit, a chuck lifting unit configured to move the chuck main body in the upward/downward direction with respect to the chuck base. To this end, the position fitting space may be provided in the form of a hole penetrating the chuck base in the upward/downward direction, and the insert may have a length that passes through the position fitting space. Further, the chuck lifting unit may be connected to a lower portion of the insert.

In yet another aspect, the present invention provides a substrate processing apparatus including: a process chamber configured to provide a substrate processing space; a substrate support assembly disposed in the substrate processing space; and a plasma generator configured to generate plasma in the substrate processing space, in which the substrate support assembly includes: an electrostatic chuck including a chuck main body disposed at an upper side of the electrostatic chuck and configured to chuck a substrate with an electrostatic force, a chuck base disposed at a lower side of the electrostatic chuck and configured to be supplied with high-frequency power and to adjust a temperature of the chuck main body, and a heat transfer layer disposed between the chuck main body and the chuck base and configured to provide a heat transfer space for accommodating a heat transfer fluid; a focus ring disposed at the periphery of the chuck main body and provided to surround the substrate; and a heat transfer fluid supply unit including a first pressure controller configured to supply the heat transfer fluid to the heat transfer space and a portion between the substrate and the chuck main body and control a pressure of the heat transfer fluid supplied to the heat transfer space, and a second pressure controller configured to control a pressure of the heat transfer fluid supplied to the portion between the substrate and the chuck main body, in which the chuck main body includes a heater for heating the substrate, and the chuck base includes a cooling flow path through which a cooling fluid for cooling the substrate flows.

According to the embodiment of the present disclosure, as a substrate processing method using the substrate processing apparatus configured as described above, there may be provided a substrate processing method including, during the substrate processing, controlling, by the first pressure controller, the pressure of the heat transfer fluid in the heat transfer space, and controlling, by the second pressure controller, the pressure of the heat transfer fluid between the substrate and the chuck main body.

In this case, before the substrate is chucked by the chuck main body, the first pressure controller may constantly control the pressure of the heat transfer fluid in the heat transfer space to a required level.

Further, after the substrate is chucked by the chuck main body, the second pressure controller controls the pressure of the heat transfer fluid between the substrate and the chuck main body. The first pressure controller may constantly control the pressure of the heat transfer fluid in the heat transfer space to the required level while the second pressure controller controls the pressure of the heat transfer fluid between the substrate and the chuck main body.

In addition, the first pressure controller may constantly control the pressure of the heat transfer fluid in the heat transfer space to the required level even while the chucked substrate is de-chucked.

The technical solutions will be more specifically and clearly described with reference to the embodiments to be described below and the drawings. In addition to the above-mentioned technical solutions, various technical solutions will be additionally provided.

According to the embodiment of the present disclosure, the heat transfer layer disposed between the chuck main body and the chuck base is configured to transfer the heat between the chuck main body and the chuck base using the heat transfer fluid. As a result, it is possible to stably transfer the heat between the chuck main body and the chuck base using the heat transfer fluid even in a high-temperature condition, thereby further improving reliability of the substrate processing.

According to the embodiment of the present disclosure, the heat transfer layer performs the heat transfer function without performing a bonding function, and the chuck main body is placed on the chuck base only by its weight without constraint and is physically in contact with the heat transfer layer. As a result, it is possible to separate the chuck main body from the chuck base only by lifting up the chuck main body, thereby more conveniently performing the maintenance of the chuck base.

The effects of the present disclosure are not limited to the above-mentioned effects, and other effects, which are not mentioned above, may be clearly understood by those skilled in the art from the present specification and the accompanying drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
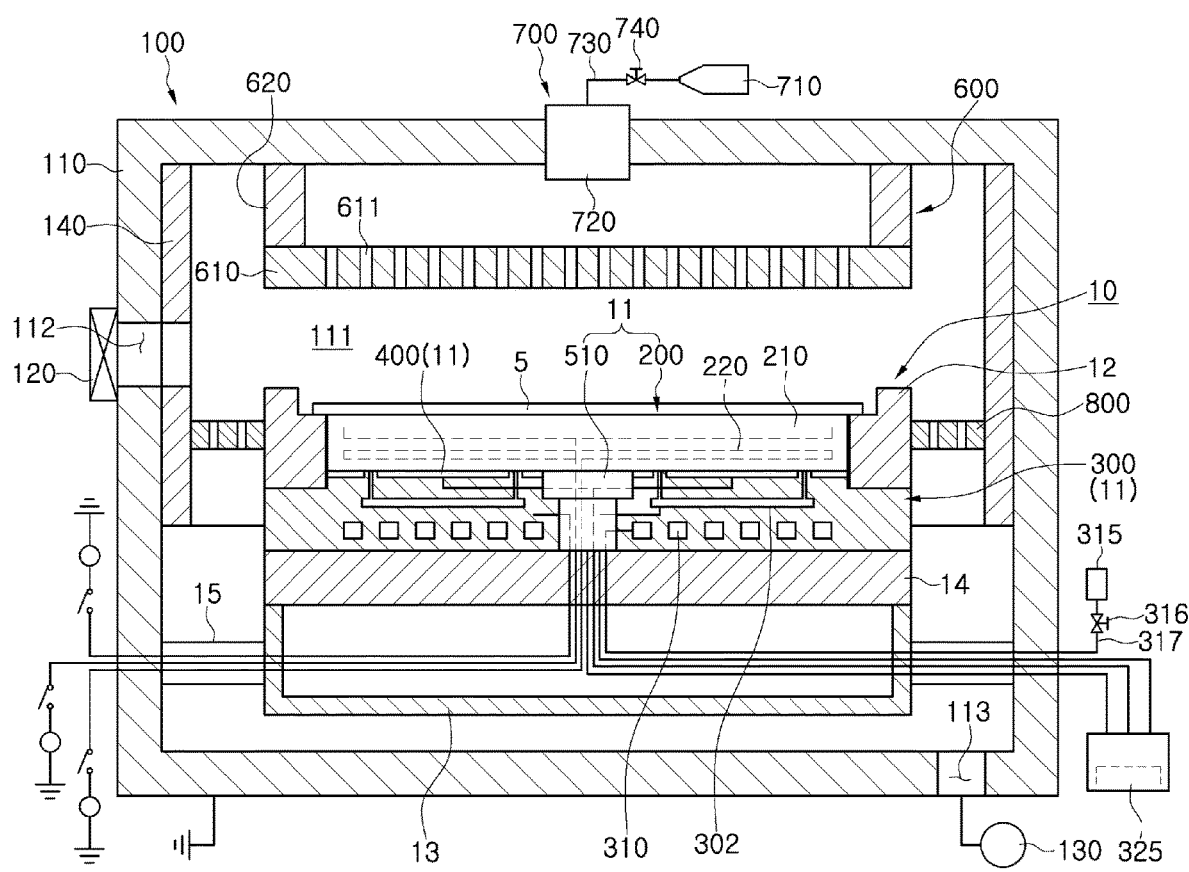
FIG. 1 is a cross-sectional view illustrating a configuration of a substrate processing apparatus according to a first embodiment of the present disclosure.

Hereinafter, embodiments of the present disclosure will be described with reference to the accompanying drawings. For reference, in the drawings used to describe the embodiment of the present disclosure, sizes of components, thicknesses of lines, and the like may be somewhat exaggerated for convenience of understanding. In addition, the terms used to describe the embodiment of the present disclosure are mainly defined in consideration of the functions in the present disclosure and may vary depending on the intention or usual practice of a user or an operator. Therefore, the definition of the terms should be made based on the entire contents of the present specification.

An electrostatic chuck according to the present disclosure may be various substrate processing apparatuses used to process substrates such as wafers or glass sheets to manufacture semiconductors, flat panel displays (FPD), and the like. A substrate processing apparatus including the electrostatic chuck according to the present disclosure may perform substrate processing such as etching, asking, deposition, and cleaning. The embodiments of the present disclosure will be described, focusing on a dry etcher that performs an etching process, among the substrate processing apparatuses using plasma.

FIG. 1 illustrates a configuration of a substrate processing apparatus according to a first embodiment of the present disclosure. Referring to FIG. 1, the substrate processing apparatus according to the first embodiment of the present disclosure is configured to perform an etching process using plasma as a process of processing a substrate 5. To this end, the substrate processing apparatus includes a process chamber 100, a substrate support assembly 10, a shower head 600, a process gas supply unit 700, an electromagnetic field forming unit, and a baffle unit 800. The process gas supply unit 700 supplies a process gas to be provided into the process chamber 100. The electromagnetic field forming unit forms an electromagnetic field in the process chamber 100 and excites the process gas provided in the process chamber 100 so that the process gas exists in a plasma state.

The process chamber 100 defines a substrate processing space 111 capable of being blocked from the outside. The substrate 5 is processed by plasma in the substrate processing space 111. The process chamber 100 includes a chamber main body 110. The chamber main body 110 is provided to have the substrate processing space 111 therein. The chamber main body 110 may be made of metal. For example, the chamber main body 110 may be made of aluminum (Al). The chamber main body 110 may be grounded.

At least one substrate port 112, which communicates with the substrate processing space 111, is provided in a wall of the chamber main body 110. The substrate 5 is loaded into the substrate processing space 111 through the substrate port 112 or unloaded from the substrate processing space 111 through the substrate port 112. The substrate port 112 may be opened or closed by a port opening/closing unit 120.

At least one exhaust port 113, which communicates with the substrate processing space 111, provided on the bottom of the chamber main body 110, and an exhaust unit 130 for discharging the gas is connected to the exhaust port 113. The exhaust unit 130 may include an exhaust line connected to the exhaust port 113, and a vacuum pump connected to the exhaust line. As the gas is discharged by the exhaust unit 130, a pressure in the substrate processing space 111 is decreased, such that the substrate processing may be performed in a vacuum ambience, and by-products, which are produced during the substrate processing, and gases, which remain in the substrate processing space 111, may be discharged to the outside.

A liner 140 may be provided on an inner surface of the chamber main body 110. The liner 140 may protect the inner surface of the chamber main body 110 from the by-products produced during the substrate processing and the gases remaining in the substrate processing space 111. For example, the liner 140 may be provided on the inner wall of the chamber main body 110 and disposed along the inner wall of the chamber main body 110. The liner 140 may have an opening provided to correspond to the substrate port 112. The opening of the liner 140 communicates with the substrate port 112 and allows the substrate 5 to be loaded or unloaded.

The substrate support assembly 10 may be installed in the chamber main body 110. The substrate support assembly 10 is disposed in a lower region in the substrate processing space 111 and supports the substrate 5. The substrate support assembly 10 may be positioned at a height at which the substrate support assembly 10 is spaced upward apart from the bottom of the chamber main body 110. The substrate support assembly 10 includes an electrostatic chuck 11, a lower cover 13, an insulation member 14, and a connection body 15.

Figure 2:
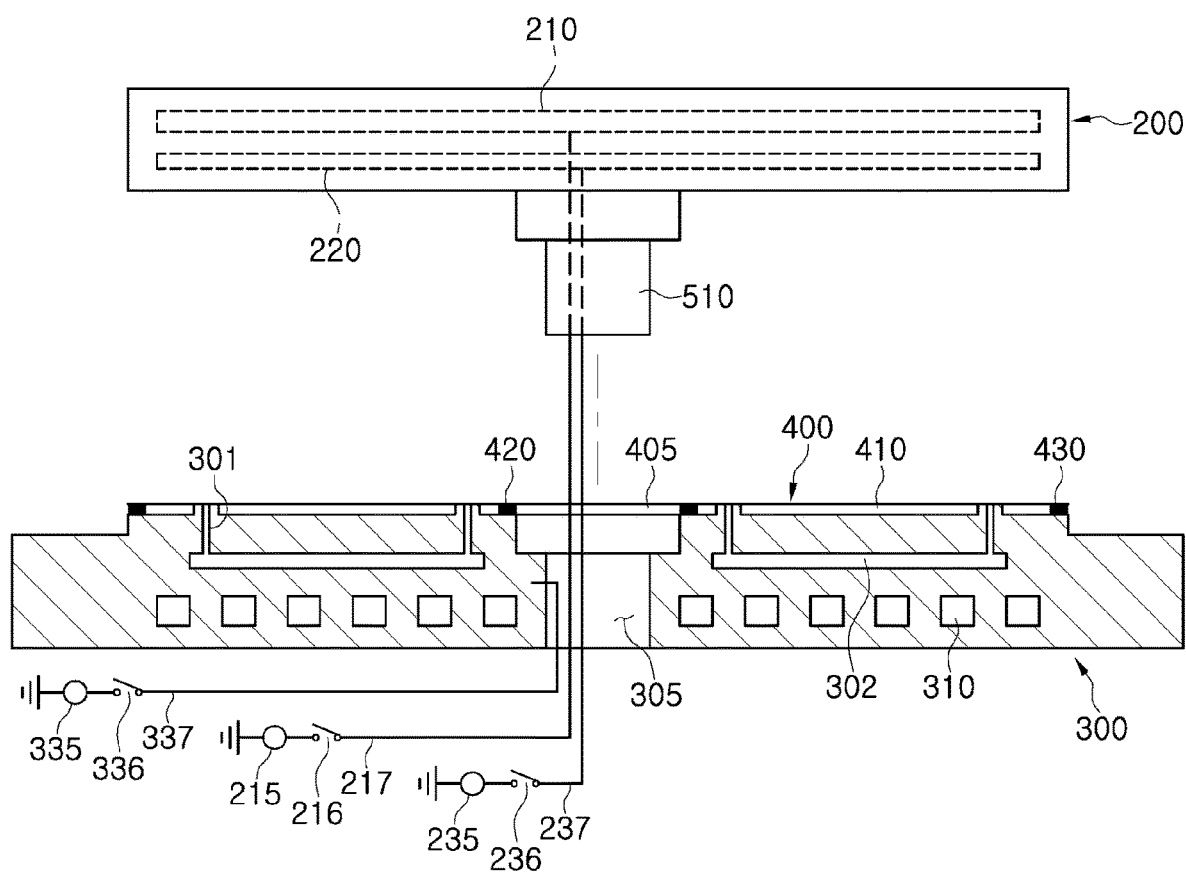
FIG. 2 is an exploded view illustrating an electrostatic chuck illustrated in FIG. 1.
Figure 3:
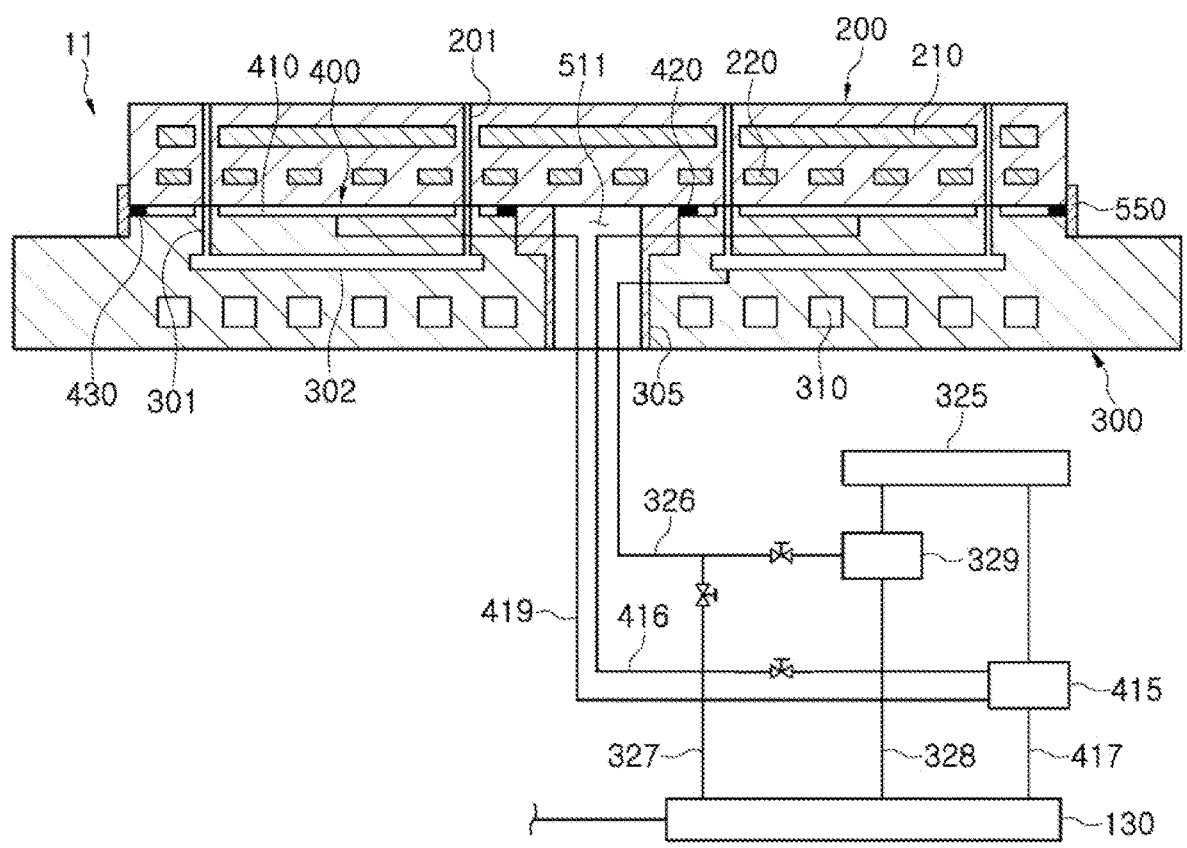
FIG. 3 is a cross-sectional view illustrating the electrostatic chuck illustrated in FIG. 1.
Figure 4:
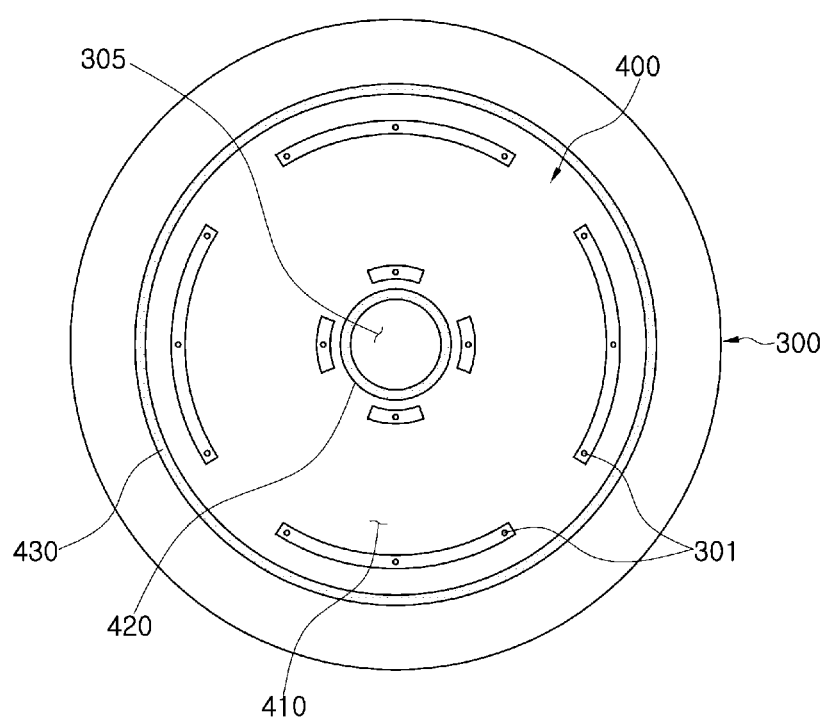
FIG. 4 is a top plan view illustrating a chuck base illustrated in FIG. 2.

FIGS. 2 to 4 illustrate the electrostatic chuck 11. Referring to FIGS. 2 to 4, the electrostatic chuck 11 includes a chuck main body 200 disposed at an upper side of the electrostatic chuck 11 and configured to attach the substrate 5 with an electrostatic force, a chuck base 300 disposed at a lower side of the electrostatic chuck 11 and configured to support the chuck main body 200, and a heat transfer layer 400 interposed between the chuck main body 200 and the chuck base 300.

The chuck main body 200 provides an upper support surface on which the substrate 5 is placed. The chuck base 300 includes a cooling element 310 for adjusting a temperature of the substrate 5 by adjusting a temperature of the chuck main body 200. The heat transfer layer 400 transfers heat between the chuck main body 200 and the chuck base 300 by using a heat transfer fluid. As a result, the heat transfer layer 400 may stably transfer heat even in a case in which a temperature in the substrate processing space 111 is increased to a high temperature by the plasma during the substrate processing.

The chuck main body 200 is made of a non-conductive material. The chuck main body 200 is placed on the chuck base 300 only by its weight without constraint and maintained only by its weight, such that the chuck main body 20 is physically in contact with the heat transfer layer 400. That is, the chuck main body 200 is simply kept in contact with the heat transfer layer 400. Therefore, the chuck main body 200 is separated from the chuck base 300 by lifting the chuck main body 200 upward. As a result, it is possible to conveniently perform the maintenance of the electrostatic chuck 11 by easily replacing the chuck main body 200 when the chuck main body 200 is contaminated or damaged as the chuck main body 200 is used over a long period of time.

An insert 510 extending downward is provided on a lower portion of the chuck main body 200. The chuck base 300 has a position fitting space 305 into which the insert 510 is inserted. The heat transfer layer 400 has a through space 405 through which the insert 510 passes. The insert 510 may be disposed at a center of the lower portion of the chuck main body 200. The position fitting space 305 is formed to correspond to the insert 510. The position fitting space 305 allows a movement of the chuck main body 200 in an upward/downward direction but restricts a movement of the chuck main body 200 in a lateral direction, such that the chuck main body 200 may be accurately set on an upper side of the chuck base 300.

FIG. 2 illustrates that the position fitting space 305 has a hole shape penetrating the chuck base 300 in the upward/downward direction. However, the position fitting space 305 may have a groove shape concavely recessed downward so as to correspond to a length of the insert 510.

The insert 510 may contain a metal material and may be coupled to the lower portion of the chuck main body 200 by brazing. For example, the brazing may be performed in such a manner that a metal film is deposited on a portion of the lower portion of the chuck main body 200 made of a non-conductive material, which is to be coupled to the insert 510, a filler made of a metal material is inserted between the metal film and the insert 510, the inserted filler is heated and melted, and then the melted filler is cooled to form a bonding layer.

The heat transfer layer 400 is provided on an upper portion of the chuck base 300 and a position of the heat transfer layer 400 is fixed. The heat transfer layer 400 is configured to provide a heat transfer space 410 disposed between the chuck main body 200 and the chuck base 300 and configured to accommodate the heat transfer fluid. The heat transfer layer 400 includes seals for providing seal capability. The seals are interposed between the chuck main body 200 and the chuck base 300. The chuck main body 200 is spaced upward apart from the chuck base 300 by an approximately thickness seal, such that a gap, which is opened at the periphery thereof, is formed between the chuck main body 200 and the chuck base 300 and communicates with the through space 405. For example, the seals of the heat transfer layer 400 include an inner seal 420 and an outer seal 430. As another example, the heat transfer layer 400 may include only the outer seal 430, unlike the configuration illustrated in the drawings.

Both the inner seal 420 and the outer seal 430 are formed in an annular shape. In an embodiment, the annular inner seal 420 and the annular outer seal 430 may be concentric. The inner seal 420 has a smaller size than the outer seal 430 and may be disposed inside the outer seal 430. The inner seal 420 performs a sealing operation by being disposed between the chuck main body 200 and the chuck base 300 and interposed in an inner region relatively close to the periphery of the through space 405 through which the insert 510 passes. The outer seal 430 performs a sealing operation by being interposed in an outer region relatively distant from the periphery of the through space 405. The heat transfer layer 400 provides the heat transfer space 410 defined by the inner seal 420, the outer seal 430, the chuck main body 200, and the chuck base 300. The inner seal 420 prevents the heat transfer fluid accommodated in the heat transfer space 410 from leaking toward the through space 405. The outer seal 430 prevents the heat transfer fluid from leaking toward the periphery of the gap (between the chuck main body and the chuck base). In a case in which the inner seal 420 is not provided, the heat transfer layer 400 may provide the heat transfer space 410 defined by the outer seal 430, the chuck main body 200, the chuck base 300, and the insert 510.

Figure 5:
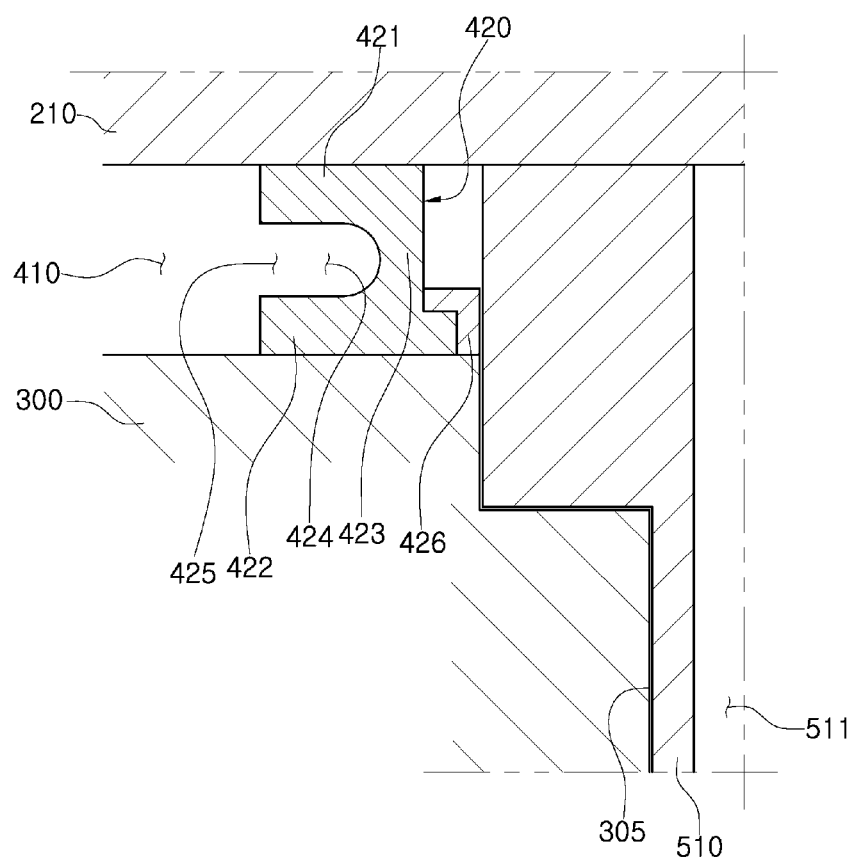
FIG. 5 is an enlarged view illustrating an inner seal illustrated in FIG. 3.

FIG. 5 illustrates the inner seal 420. Referring to FIG. 5, the inner seal 420 includes an annular upper member 421 having an upper surface being in contact with a lower surface of the chuck main body 200, an annular lower member 422 disposed to face the upper member 421 at a vertical interval and having a lower surface being in contact with an upper surface of the chuck base 300, and an annular connecting member 423 configured to connect an inner portion of the upper member 421 and an inner portion of the annular lower member 422. As a result, the inner seal 420 has a structure in which an annular hollow portion 424 is provided and a connection opening 425 is disposed between an outer portion of the upper member 421 and an outer portion of the annular lower member 422 and allows the hollow portion 424 to communicate with the heat transfer space 410. The upper member 421, the annular lower member 422, and the connecting member 423 of the inner seal 420 may be integrally formed. The position of the inner seal 420 is fixed as the annular lower member 422 is coupled to the chuck base 300 by means of a fixing member 426. The inner seal 420 and the fixing member 426 may be made of a heat resistance material capable of sufficiently withstanding a high temperature during the substrate processing. For example, the inner seal 420 may include a polytetrafluoroethylene (PTFE) material which is excellent in heat resistance, durability, modulus of bending elasticity, and the like.

Figure 6:
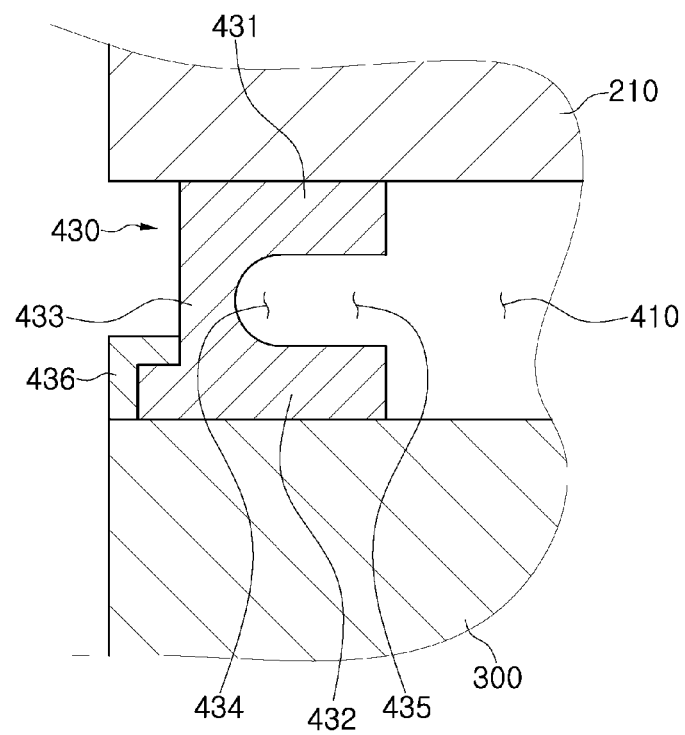
FIG. 6 is an enlarged view illustrating an outer seal illustrated in FIG. 3.

FIG. 6 illustrates the outer seal 430. Referring to FIG. 6, the outer seal 430 includes an annular upper member 431 having an upper surface being in contact with the lower surface of the chuck main body 200, an annular lower member 432 disposed to face the annular upper member 431 at a vertical interval and having a lower surface being in contact with the upper surface of the chuck base 300, and an annular connecting member 433 configured to connect an outer portion of the annular upper member 431 and an outer portion of the annular lower member 432. As a result, the outer seal 430 has a structure in which an annular hollow portion 434 is provided and a connection opening 435 is disposed between an inner portion of the annular upper member 431 and an inner portion of the lower member 432 and allows the hollow portion 434 to communicate with the heat transfer space 410. The annular upper member 431, the annular lower member 432, and the annular connecting member 433 of the outer seal 430 may be integrally formed. The position of the outer seal 430 is fixed as the annular lower member 432 is coupled to the chuck base 300 by means of a fixing member 436. The outer seal 430 and the fixing member 436 may be made of a heat resistance material capable of sufficiently withstanding a high temperature during the substrate processing. For example, the outer seal 430 may include or may be formed of a polytetrafluoroethylene (PTFE) material which is excellent in heat resistance, durability, modulus of bending elasticity, and the like.

A heat transfer fluid supply unit is connected to the heat transfer space 410. The heat transfer fluid supply unit may supply the heat transfer space 410 with the amount of heat transfer fluid controlled by settings and may collect the amount of supplied heat transfer fluid controlled by settings from the heat transfer space 410. Further, the heat transfer fluid supply unit may discharge the used heat transfer fluid from the heat transfer space 410 and continuously supply the heat transfer space 410 with a new heat transfer fluid, thereby preventing a deterioration in heat transfer efficiency of the heat transfer layer 400. The heat transfer fluid may be a gas. Specifically, the heat transfer fluid may include an inert gas. For example, the inert gas may include helium (He).

Referring to FIG. 3, the heat transfer fluid supply unit may include a heat transfer fluid supply source 325, a first pressure controller 415, a first heat transfer fluid supply line 416, and a first roughing line 417. The first pressure controller 415 may be supplied with the heat transfer fluid from the heat transfer fluid supply source 325 and may provide a part or the entirety of the supplied heat transfer fluid to the exhaust unit 130 through the first roughing line 417 to discharge the heat transfer fluid. The first roughing line 417 may be connected between the first pressure controller 415 and the exhaust unit 130. The first pressure controller 415 may supply a part or the entirety of the heat transfer fluid, which is supplied from the heat transfer fluid supply source 325, to the heat transfer space 410 through the first heat transfer fluid supply line 416. The heat transfer fluid supply unit may further include a heat transfer fluid return line 419 through which the heat transfer fluid is collected from the heat transfer space 410. The heat transfer fluid return line 419 is connected between the heat transfer space 410 and the first pressure controller 415. As a result, during the substrate processing, the heat transfer fluid may be continuously supplied to the heat transfer space 410, and a pressure of the heat transfer fluid in the heat transfer space 410 may be appropriately adjusted to a level required for the substrate processing as the first pressure controller 415 controls a supply flow rate and a return flow rate of the heat transfer fluid. The heat transfer fluid, which is provided to the first pressure controller 415 from the heat transfer space 410 through the heat transfer fluid return line 419, may be discharged to the outside of the substrate processing space 111 along the first roughing line 417 by the operation of the exhaust unit 130.

The heat transfer space 410 is filled with the fluid supplied to the heat transfer space 410 by the heat transfer fluid supply unit. Further, the heat transfer fluid is introduced into the hollow portions 424 and 434 of the inner seal 420 and the outer seal 430 through the connection openings 425 and 435 of the inner seal 420 and the outer seal 430, such that the hollow portions 424 and 434 are also filled with the heat transfer fluid. The heat transfer fluid, which fills the hollow portions 424 and 434 of the inner seal 420 and the outer seal 430, presses the annular upper members 421 and 431 and the annular lower members 422 and 432 of the inner seal 420 and the outer seal 430 in a direction in which the annular upper members 421 and 431 move away from each other and the annular lower members 422 and 432 move away from each other. As a result, seal capability implemented by the inner seal 420 and the outer seal 430 is improved.

The electrostatic chuck 11 further include a seal protection member 550 configured to protect the outer seal 430 from the plasma or the like produced during the substrate processing. The seal protection member 550 is disposed outside the outer seal 430, has an annular shape, and covers the outer seal 430. The seal protection member 550 may be provided in the form of a band, a seal, or the like.

The chuck main body 200 is made of a dielectric substance and may be provided in the form of a plate having the upper support surface on which the substrate 5 is placed. The chuck main body 200 includes a chuck electrode 210 and a heating element 220.

The chuck electrode 210 is provided in the chuck main body 200 and electrically connected to a chuck power source 215 through a chuck power line 217. The chuck power source 215 may include a direct-current power source. A chuck power switch 216 is applied between the chuck electrode 210 and the chuck power source 215, such that the chuck electrode 210 and the chuck power source 215 may be electrically connected to or disconnected from each other as the chuck power switch 216 is turned on or off. When the chuck power switch 216 is turned on, an electrostatic force is generated between the substrate 5 and the chuck electrode 210, and the substrate 5 may be attached to the chuck main body 200 by the generated electrostatic force.

A heater, which is the heating element 220, is provided in the chuck main body 200. The heater 220 may be disposed below the chuck electrode 210. The heater 220 is electrically connected to a heater power source 235 through a heater power line 237. The heater 220 may be configured to generate heat by means of resistance against an electric current supplied from the heater power source 235. The heater 220 may include a spiral coil. A heater power switch 236 may be applied between the heater 220 and the heater power source 235. The heater 220 and the heater power source 235 may be electrically connected to or disconnected from each other as the heater power switch 236 is turned on or off. When the heater power switch 236 is turned on, the heater 220 generates heat, the generated heat is transferred to the substrate 5 through the chuck main body 200, and the substrate 5 may be maintained at a temperature required for the substrate processing by the transferred heat. Therefore, the heater 220 constitutes a substrate heating unit.

The chuck base 300 may include or may be formed of a metal plate. As an example, the entire chuck base 300 may be provided in the form of a metal plate. The chuck base 300 is electrically connected to a high-frequency power source 335 through a high-frequency power line 337, and the high-frequency power source 335 generates high-frequency power. The high-frequency power source 335 may be provided as an RF power source. A high-frequency power switch 336 is applied between the chuck base 300 and the high-frequency power source 335. The chuck base 300 and the high-frequency power source 335 may be electrically connected to or disconnected from each other as the high-frequency power switch 336 is turned on or off. When the high-frequency power switch 336 is turned on, the chuck base 300 is supplied with high-frequency power from the high-frequency power source 335. Therefore, the chuck base 300 may serve as a lower electrode constituting the electromagnetic field forming unit.

The cooling element 310 is provided in the chuck base 300 and provided in the form of a cooling flow path through which a cooling fluid flows. The cooling flow path 310 is connected to a cooling fluid supply source 315 through a cooling fluid supply line 317. A cooler for cooling the cooling fluid is installed in the cooling fluid supply source 315 or the cooling fluid supply line 317. An on-off valve 316 may be installed in the cooling fluid supply line 317. The cooling fluid supplied to the cooling flow path 310 cools the chuck base 300. The chuck base 300 may be cooled by the cooling fluid and thus may cool the substrate 5 together with the chuck main body 200, thereby maintaining the substrate 5 at a temperature required for the process. Although not illustrated, the cooling fluid may be returned to the cooling fluid supply source 315 from the cooling flow path 310 through a cooling fluid return line.

The chuck main body 200 has a plurality of upper supply passages 201 for supplying the heat transfer fluid to a lower surface of the substrate 5 placed on the chuck main body 200. The upper supply passages 201 are spaced apart from one another and provided to penetrate the chuck main body 200 in the upward/downward direction. The chuck base 300 has a plurality of lower supply passages 301. The lower supply passages 301 extend from the inside of the chuck base 300 to the upper surface of the chuck base and are connected to the upper supply passages 201. The number and the positions of the lower supply passages 301 correspond to those of the upper supply passages 201. Distribution flow paths 302 are provided in the chuck base 300 to connect the lower supply passages 301. Sealing members for providing seal capability may be interposed between the upper supply passages 201 and the lower supply passages 301, respectively. The sealing members may be applied at upper ends of the lower supply passages 301.

Referring to FIG. 3, the distribution flow path 302 is connected to the heat transfer fluid supply source 325 through a second heat transfer fluid supply line 326. As described above, the heat transfer fluid may include an inert gas, and the inert gas may contain helium. Before the substrate 5 is attached to the chuck main body 200, a second pressure controller 329 may be supplied with the heat transfer fluid from the heat transfer fluid supply source 325 and may provide the heat transfer fluid to the exhaust unit 130 through a second roughing line 328 to discharge the heat transfer fluid. The second roughing line 328 may be connected between the second pressure controller 329 and the exhaust unit 130. When the substrate 5 is attached to the chuck main body 200, the second pressure controller 329 may supply the heat transfer fluid, which is supplied from the heat transfer fluid supply source 325, to the distribution flow path 302 through the second heat transfer fluid supply line 326. The heat transfer fluid is supplied to the lower surface of the substrate 5 while sequentially passing through the lower supply passages 301 and the upper supply passages 201. In addition, the heat transfer fluid may also flow to the exhaust unit 130 through the second roughing line 328. The heat transfer fluid supplied to the lower surface of the substrate 5 serves as a medium for transferring the heat, which is transferred from the plasma to the substrate 5, to the electrostatic chuck 11. For example, the second pressure controller 329 may control a pressure of the heat transfer fluid to be supplied to the lower surface of the substrate 5. In order to detach the substrate 5, the second pressure controller 329 may discharge the heat transfer fluid, which has been supplied to the lower surface of the substrate 5, to the exhaust unit 130 through the upper supply passages 201, the lower supply passages 301, the second heat transfer fluid supply line 326, and a dump line 327. The heat transfer fluid remaining on the lower surface of the substrate 5 may be discharged or returned to the exhaust unit 130 through the dump line 327.

Meanwhile, the distribution flow path 302 may be connected, through the second heat transfer fluid supply line 326, to a separate heat transfer fluid supply source 325 different from the heat transfer fluid supply source 325.

The upper support surface of the chuck main body 200 on which the substrate 5 is placed has a smaller size than the substrate 5, such that an edge region of the substrate 5 supported by the chuck main body 200 may be positioned outside the upper support surface. A focus ring 12 may be disposed around the chuck main body 200. The focus ring 12 may be stepped in such a way that an outer portion of an upper surface of the focus ring 12 is higher than an inner portion of the upper surface of the focus ring 12. The inner portion of the upper surface of the focus ring 12 is positioned at the same height as the upper support surface of the chuck main body 200. The inner portion of the upper surface of the focus ring 12 supports the edge region of the substrate 5 which is positioned outside the upper support surface of the chuck main body 200. The outer portion of the upper surface of the focus ring 12 is provided to surround the substrate 5. The focus ring 12 controls the electromagnetic field so that density of the plasma is uniformly distributed in the entire region of the substrate 5. Since the plasma is uniformly formed over the entire region of the substrate 5, the substrate 5 may be more uniformly etched.

The lower cover 13 is disposed below the electrostatic chuck 11. The lower cover 13 constitutes a lower end portion of the substrate support assembly 10. The lower cover 13 is positioned to be spaced upward apart from the bottom of the chamber main body 110. The lower cover 13 has therein a space opened at an upper side thereof. A bottom surface of the lower cover 13 may be made of a metal material.

The insulation member 14 is disposed between the electrostatic chuck 11 and the lower cover 13. The insulation member 14 covers the opened upper side of the lower cover 13. The insulation member 14 may include an insulator. The insulation member 14 electrically insulates the chuck base 300 and the lower cover 13.

The connection body 15 connects an outer portion of the lower cover 13 and the wall of the chamber main body 110, supports the substrate support assembly 10 in the chamber main body 110, and connects the lower cover 13 to the ground. The connection body 15 may be provided in plural, and the plurality of connection bodies 15 may be disposed at intervals around the lower cover 13 so as to be spaced apart from one another.

The connection body 15 is provided to have a structure having a vacant inner space. The first heat transfer fluid supply line 416 and the heat transfer fluid return line 419 connected to the heat transfer space 410, the cooling fluid supply line 317 and the cooling fluid return line connected to the cooling flow path 310, the second heat transfer fluid supply line 326 connected to the distribution flow path 302, the chuck power line 217 connected to the chuck electrode 210, the heater power line 237 connected to the heater 220, and the high-frequency power line 337 connected to the chuck base 300 may be introduced into the lower cover 13 through the vacant inner space of the connection body 15. In addition, the lines, which are introduced in this manner, may pass through the insulation member 14, and then may be introduced into the electrostatic chuck 11 through the insert 510. To this end, the insert 510 may be structured to have a cavity 511 provided in the upward/downward direction so that the lines are introduced into the cavity 511.

The shower head 600 is installed at a ceiling side of the chamber main body 110. The shower head 600 is disposed in an upper region of the substrate processing space 111 so as to face the electrostatic chuck 11. The shower head 600 discharges a process gas to the substrate processing space 111 from the process gas supply unit 700. The shower head 600 includes a shower plate 610 and a support member 620.

The shower plate 610 is positioned at a height at which the shower plate 610 is spaced downward apart from the ceiling of the chamber main body 110. The shower plate 610 has discharge ports 611 through which the process gas is discharged downward. The discharge ports 611 are shaped to penetrate the shower plate 610 in the upward/downward direction, and the number and the structures of the discharge ports 611 may be set such that the process gas may be uniformly supplied to the substrate processing space 111. The shower plate 610 contains a metal material. A surface of the shower plate 610 may be selectively or entirely processed to be a positive electrode in order to prevent the occurrence of arc caused by the plasma. The shower plate 610 is grounded or electrically connected to the high-frequency power source that generates high-frequency power. Therefore, the shower plate 610 may serve as an upper electrode constituting the electromagnetic field forming unit.

The support member 620 is mounted on the ceiling of the chamber main body 110 and supports an edge portion of the shower plate 610. The support member 620 is formed to block a portion defined by the ceiling of the chamber main body 110 and an upper surface of the shower plate 610. The support member 620 may be made of a nonmetal material.

The process gas supply unit 700 provides the process gas to the substrate processing space 111. The process gas supply unit 700 includes a process gas supply source 710, a process gas supply nozzle 720, a process gas supply line 730, and a flow rate control valve 740. The process gas supply nozzle 720 is installed on the ceiling of the chamber main body 110, has a structure connected to the shower head 600, and supplies the process gas to the shower head 600. The process gas supply line 730 connects the process gas supply source 710 and the process gas supply nozzle 720. The flow rate control valve 740 is installed in the process gas supply line 730. The flow rate control valve 740 may adjust a flow rate of the process gas to be provided to the process gas supply nozzle 720 through the process gas supply line 730.

The electromagnetic field forming unit, together with the shower head 600 and the process gas supply unit 700, constitutes a plasma generator. The electromagnetic field forming unit includes the upper electrode and the lower electrode disposed in the substrate processing space 111 in the upward/downward direction so as to be parallel to each other, such that the electromagnetic field forming unit is configured to generate the plasma using a capacitive coupled plasma (CCP) method. The shower plate 610 may serve as the upper electrode, and the chuck base 300 may serve as the lower electrode. Otherwise, the electromagnetic field forming unit may be configured to generate the plasma using an inductively coupled plasma (ICP) method. To this end, the electromagnetic field forming unit may include an antenna.

The baffle unit 800 includes a baffle. The baffle may be installed around the substrate support assembly 10 and disposed between the wall of the chamber main body 110 and a circumference of the electrostatic chuck 11. The baffle may have process gas passing holes. The process gas supplied to the substrate processing space 111 may be discharged to the exhaust port 113 while passing through the process gas passing holes of the baffle. The flow of the process gas in the substrate processing space 111 may be controlled by shapes or the like of the baffle and the process gas passing holes.

Meanwhile, the substrate processing apparatus according to the first embodiment of the present disclosure may further include a chuck pressing unit configured to maintain a state in which the chuck main body 200 and the chuck base 300 are in close contact with the heat transfer layer 400. Although not illustrated, the chuck pressing unit may include a weight applied to the chuck main body 200 to increase the weight of the chuck main body 200. The weight may press the chuck main body 200 against the chuck base 300 to increase a contact pressure of the chuck main body 200 and the chuck base 300 against the heat transfer layer 400, thereby bringing the chuck main body 200 and the chuck base 300 further tightly into contact with the heat transfer layer 400. During the substrate processing, an internal pressure of the heat transfer space 410 needs to be maintained by the first pressure controller 415 at a level at which the heat transfer fluid does not leak. The application of the weight may increase a pressing force of the chuck main body 200 to the heat transfer layer 400. Therefore, the internal pressure of the heat transfer space 410 may be maintained to be a high pressure, thereby improving heat transfer efficiency implemented by the heat transfer fluid.

Figure 7:
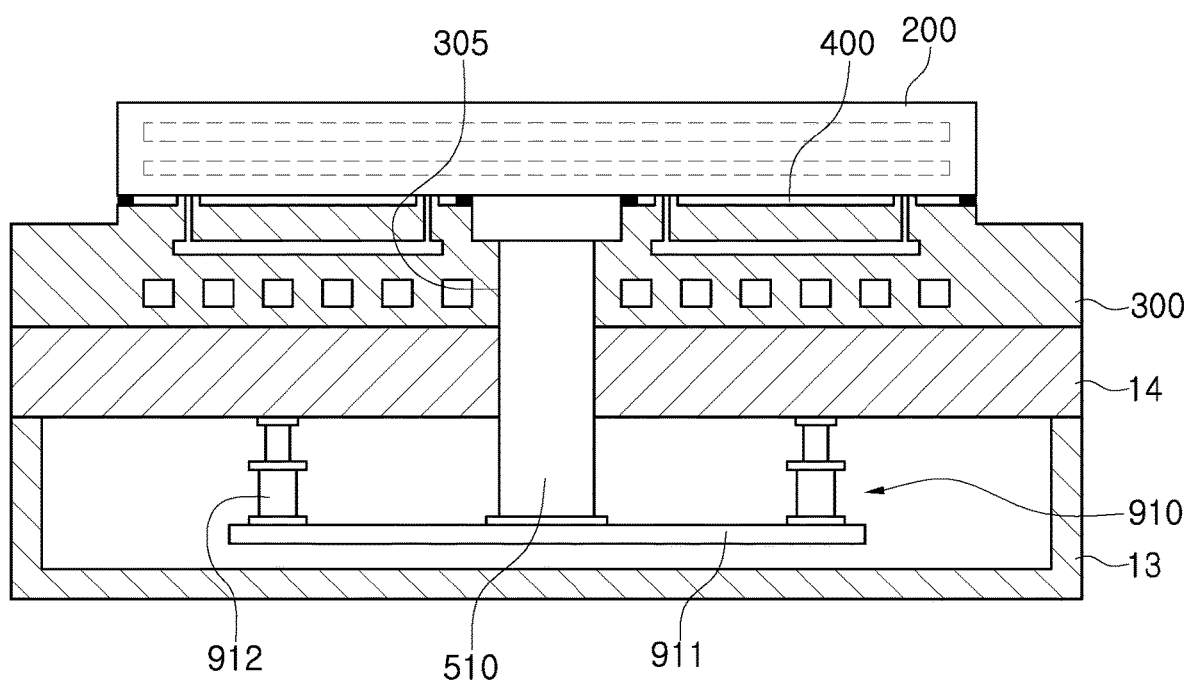
FIGS. 7 and 8 are cross-sectional views illustrating a configuration and an operation of a substrate processing apparatus according to a second embodiment of the present disclosure.
Figure 8:
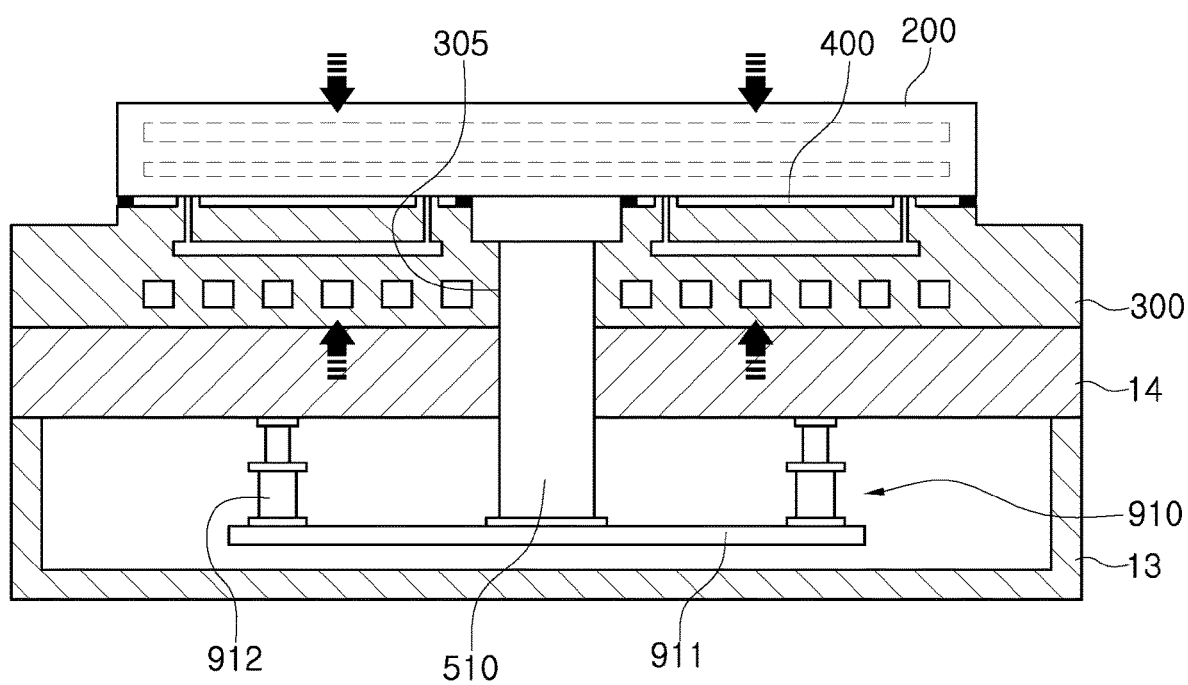

FIGS. 7 and 8 schematically illustrate a configuration of a substrate processing apparatus according to a second embodiment of the present disclosure. As illustrated in FIGS. 7 and 8, the substrate processing apparatus according to the second embodiment of the present disclosure is different from the substrate processing apparatus according to the first embodiment of the present disclosure only in that a chuck pressing unit 910 uses a pressing force generating device 912 such as a cylinder to increase the contact pressure of the chuck main body 200 and the chuck base 300 against the heat transfer layer 400 in order to maintain the state in which the chuck main body 200 and the chuck base 300 are in close contact with the heat transfer layer 400. However, the substrate processing apparatus according to the second embodiment of the present disclosure is identical to the substrate processing apparatus according to the first embodiment of the present disclosure in terms of the other components and operations. This configuration will be described below.

The insert 510 sequentially penetrates the chuck base 300 and the insulation member 14 in the upward/downward direction, and a lower end portion of the insert 510 is positioned in the lower cover 13. The chuck pressing unit 910 includes an auxiliary plate 911 and the pressing force generating device 912. The auxiliary plate 911 is disposed in the lower cover 13 so as to face the chuck base 300 and connected to the lower end portion of the insert 510. The pressing force generating device 912 may apply a downward force to the auxiliary plate 911 to press the chuck main body 200 against the chuck base 300.

For example, the pressing force generating device 912 may include pneumatic cylinders or hydraulic cylinders disposed between the auxiliary plate 911 and the chuck base 300. One side of the cylinder may be supported on the auxiliary plate 911, and the other side of the cylinder may be supported on the insulation member 14. When the cylinders are extended, a force is applied to the insulation member 14 and the auxiliary plate 911 in a direction in which the insulation member 14 and the auxiliary plate 911 move away from each other. Therefore, a downward force is applied to the chuck main body 200 connected to the auxiliary plate 911 through the insert 510, and an upward force is applied to the chuck base 300, such that the chuck main body 200 and the chuck base 300 may press the heat transfer layer 400 disposed between the chuck main body 200 and the chuck base 300 (see FIG. 8). Of course, when the cylinders are contracted, the chuck main body 200 and the chuck base 300 are released from the heat transfer layer 400 (see FIG. 7).

As another example, instead of the cylinders, compressed elastic members, such as springs, may be interposed between the auxiliary plate 911 and the chuck base 300, or a mechanism including a ball screw configured to be extended or retracted by a motor may be applied. In a case in which the insulation member 14 is not provided, the pressing force generating device 912 may be supported on the lower surface of the chuck base 300. In a case in which the lower cover 13 is not provided, the pressing force generating device 912 may be provided between the bottom of the chamber main body 110 and the electrostatic chuck 11.

The insert 510 may be separably coupled to the auxiliary plate 911. Therefore, the chuck main body 200 may be separated from the chuck base 300 by separating the insert 510 from the auxiliary plate 911 and lifting up the chuck main body 200.

Figure 9:
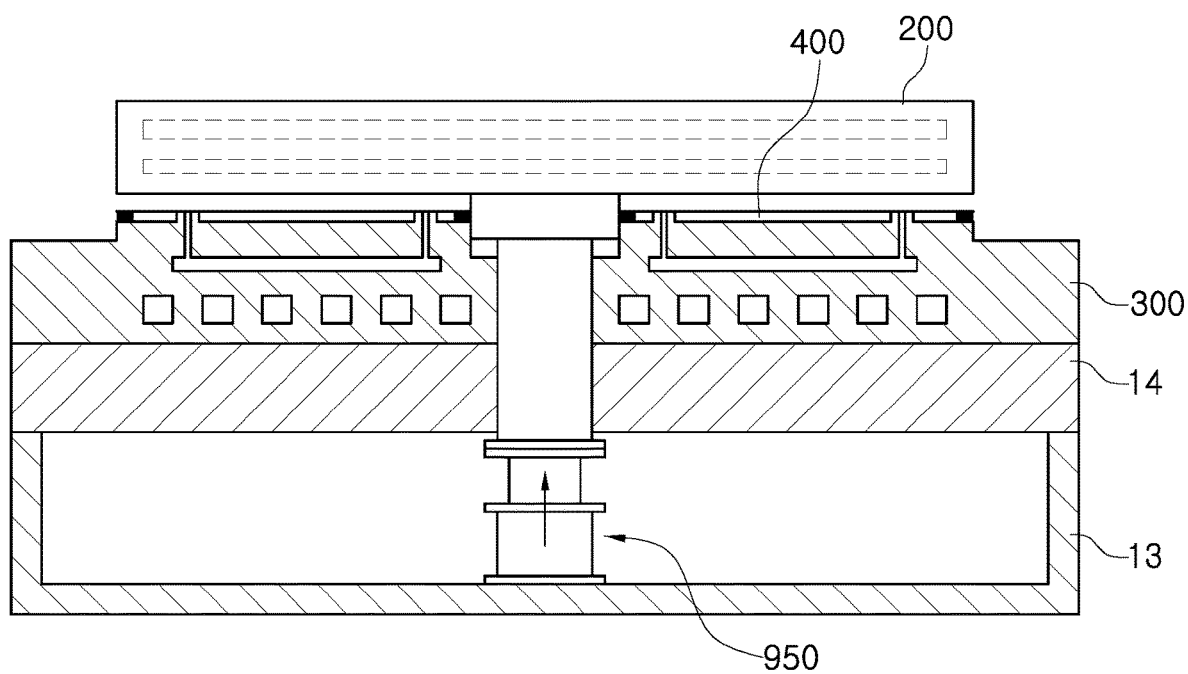
FIGS. 9 and 10 are cross-sectional views illustrating a configuration and an operation of a substrate processing apparatus according to a third embodiment of the present disclosure.
Figure 10:
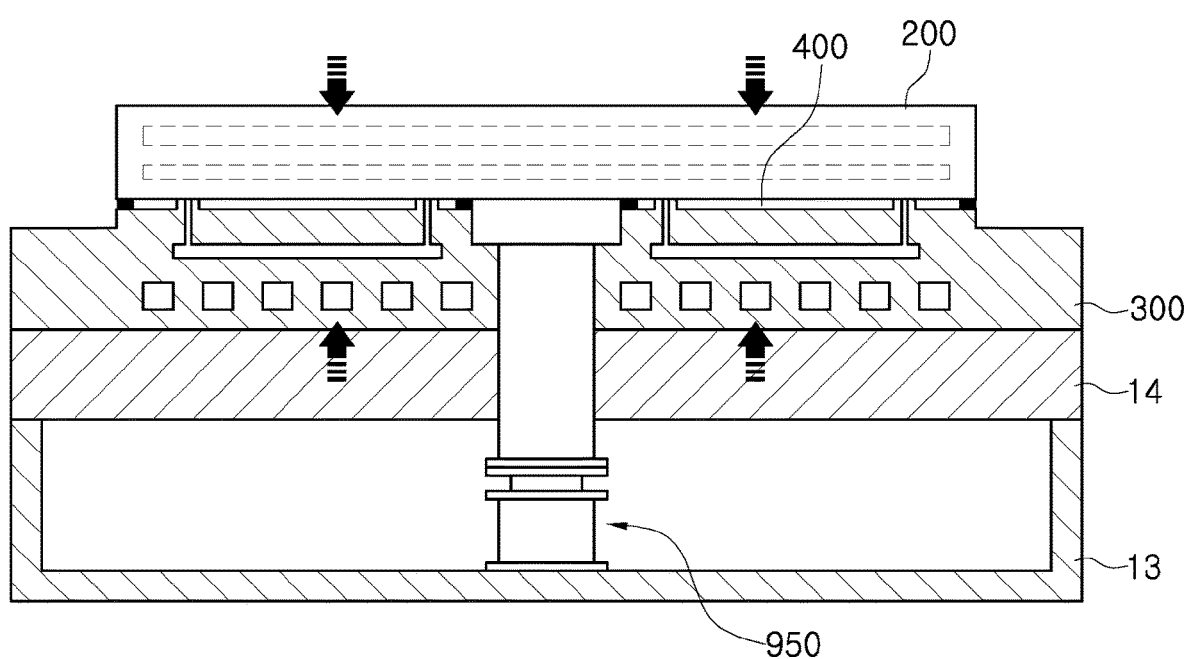

FIGS. 9 and 10 schematically illustrate a configuration of a substrate processing apparatus according to a third embodiment of the present disclosure. As illustrated in FIGS. 9 and 10, the substrate processing apparatus according to the third embodiment of the present disclosure is different from the substrate processing apparatus according to the first or second embodiment of the present disclosure only in that a chuck lifting unit 950 is applied instead of the chuck pressing unit. However, the substrate processing apparatus according to the third embodiment of the present disclosure is identical to the substrate processing apparatus according to the first or second embodiment of the present disclosure in terms of the other components and operations. This configuration will be described below.

The insert 510 sequentially penetrates the chuck base 300 and the insulation member 14 in the upward/downward direction, and the lower end portion of the insert 510 is positioned in the lower cover 13. The chuck lifting unit 950 is installed in the lower cover 13 and connected to the lower end portion of the insert 510. The chuck lifting unit 950 may include a cylinder using a pneumatic pressure or a hydraulic pressure or include a power transmission mechanism that converts a rotational motion of a motor into a rectilinear motion and transmits the rectilinear motion to the insert 510.

When the chuck main body 200 is raised by the chuck lifting unit 950, the chuck main body 200 is spaced upward apart from the chuck base 300 (see FIG. 9). Before the chuck main body 200 is raised, the supply of the heat transfer fluid to the heat transfer layer 400 may be cut off, and the heat transfer fluid may be collected from the heat transfer layer 400. When the chuck main body 200 is spaced apart from the chuck base 300, the chuck main body 200 is cooled and then heated by the heater disposed in the chuck main body 200, such that the chuck main body 200 may be more quickly heated.

When the chuck main body 200 is lowered by the chuck lifting unit 950, the chuck main body 200 is placed on the chuck base 300, and the heat transfer space constituting the heat transfer layer 400 is provided in the gap between the chuck main body 200 and the chuck base 300. When the chuck lifting unit 950 lowers the chuck main body 200, the chuck lifting unit 950 may adjust the position of the chuck main body 200 so that the chuck main body 200 is in close contact with the heat transfer layer 400 (see FIG. 10).

Meanwhile, the chuck lifting unit 950 may be separably coupled to the insert 510.

Figure 11:
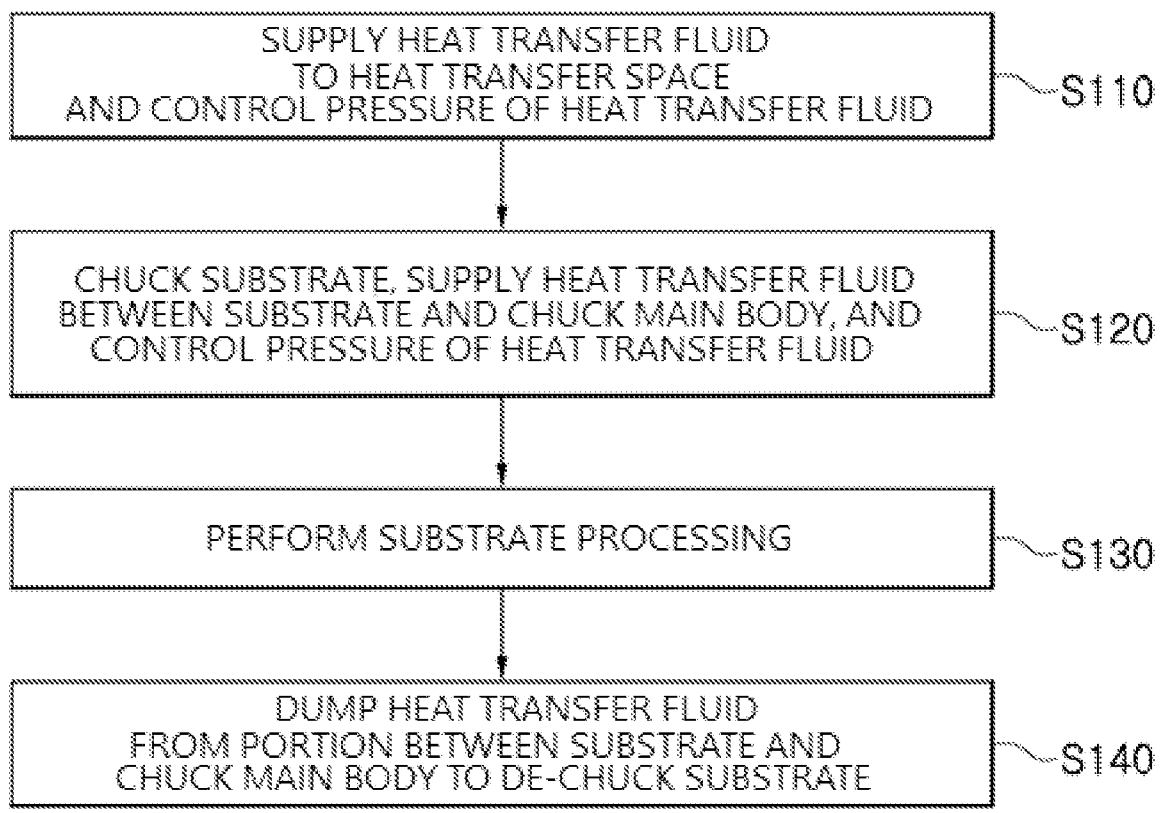
FIG. 11 is a flowchart illustrating a substrate processing method according to the embodiment of the present disclosure.

FIG. 11 is a flowchart illustrating a substrate processing method to be performed by any one of the substrate processing apparatuses according to the first to third embodiments of the present disclosure. FIG. 11 will be described with reference to FIGS. 1 to 10.

In a step S110, the first pressure controller 415 may supply the heat transfer fluid, which is supplied from the heat transfer fluid supply source 325, to the heat transfer space 410 of the heat transfer layer 400 provided between the chuck main body 200 and the chuck base 300. The first pressure controller 415 may control the pressure of the heat transfer fluid supplied to the heat transfer space 410. The second pressure controller 329 may discharge the heat transfer fluid, which is supplied from the heat transfer fluid supply source 325, through the second roughing line 328 instead of supplying the heat transfer fluid to the lower surface of the substrate 5 loaded onto the chuck main body 200 (i.e., between the substrate 5 and the chuck main body 200). The step S110 may be referred to as an idle step.

In a step S120, first, the substrate 5 may be chucked on the chuck main body 200 by the electrostatic force. Thereafter, the second pressure controller 329 may supply the heat transfer fluid to the lower surface of the substrate 5 and control the pressure of the heat transfer fluid in the space between the chuck main body 200 and the substrate 5. Like the step S110, the first pressure controller 415 may continuously supply the heat transfer fluid to the heat transfer space 410 and control the pressure of the heat transfer fluid of the heat transfer space 410 while the second pressure controller 329 controls the pressure of the heat transfer fluid in the space between the chuck main body 200 and the substrate 5. The step S120 may be referred to as a chucking step.

In a step S130, the substrate 5 may be processed. Even in the step S130, the second pressure controller 329 may supply the heat transfer fluid to the lower surface of the substrate 5 and control the pressure of the heat transfer fluid in the gap between the chuck main body 200 and the substrate 5. Even in the step S130, the first pressure controller 415 may supply the heat transfer fluid to the heat transfer space 410 and control the pressure of the heat transfer fluid in the heat transfer space 410. The step S130 may be referred to as a substrate processing performing step.

In a step S140, the second pressure controller 329 may dump or discharge the heat transfer fluid from the space between the chuck main body 200 and the substrate 5 in order to de-chuck the substrate 5. Even during the process of de-chucking the substrate 5, the first pressure controller 415 may supply the heat transfer fluid to the heat transfer space

410 and control the pressure of the heat transfer fluid in the heat transfer space 410. The step S140 may be referred to as a de-chucking step.

While the present disclosure has been described above, the present disclosure is not limited to the disclosed embodiments and the accompanying drawings, and those skilled in the art may variously modify the present disclosure without departing from the technical spirit of the present disclosure. In addition, the technical features described in the embodiments of the present disclosure may be independently carried out or two or more technical features may be combined.

What is claimed is:

1. An electrostatic chuck comprising:
 a chuck main body disposed at an upper side of the electrostatic chuck and configured to hold a substrate with an electrostatic force;
 a chuck base disposed at a lower side of the electrostatic chuck and configured to receive high-frequency power and adjust a temperature of the chuck main body;
 a heat transfer layer disposed between the chuck main body and the chuck base and configured to transfer heat between the chuck base and the chuck main body using a heat transfer fluid;
 an insert including an upper end which is connected to a lower surface of the chuck main body and extends downward; and
 a chuck pressing unit configured to maintain a state in which the heat transfer layer contacts each of the chuck main body and the chuck base,
 wherein the chuck base has a hole through which the insert passes,
 wherein the heat transfer layer has a through space through which the insert passes, and
 wherein an upper end of the chuck pressing unit is connected to a lower surface of the chuck base and a lower end of the chuck pressing unit is connected to a lower end of the insert so that the chuck pressing unit applies a downward force to the lower end of the insert.

2. The electrostatic chuck of claim 1,
 wherein the heat transfer layer provides a heat transfer space disposed between the chuck main body and the chuck base and configured to accommodate the heat transfer fluid.

3. The electrostatic chuck of claim 2,
 wherein the heat transfer layer comprises an annular outer seal disposed at an outer region of the heat transfer layer and interposed between the chuck main body and the chuck base, such that a gap is formed between the chuck main body and the chuck base, and
 wherein the heat transfer space is defined by the chuck main body, the chuck base, and the annular outer seal.

4. The electrostatic chuck of claim 3,
 wherein the annular outer seal has a hollow portion connected to the heat transfer space, and
 wherein the hollow portion is filled with the heat transfer fluid.

5. The electrostatic chuck of claim 3,
 wherein the annular outer seal comprises a heat resistance material.

6. The electrostatic chuck of claim 3, further comprising:
 a seal protection member covering the annular outer seal.

7. The electrostatic chuck of claim 2,
 wherein a heat transfer fluid supply line is connected to the heat transfer space.

8. The electrostatic chuck of claim 7,
 wherein a heat transfer fluid return line is connected to the heat transfer space.

9. The electrostatic chuck of claim 1,
 wherein the chuck main body is placed on the chuck base, and
 wherein the chuck main body contacts the heat transfer layer.

10. The electrostatic chuck of claim 9,
 wherein the heat transfer layer is provided on an upper portion of the chuck base.

11. The electrostatic chuck of claim 1,
 wherein the heat transfer layer comprises:
 an annular inner seal disposed at an inner region relatively close to a periphery of the through space; and
 an annular outer seal disposed at an outer region relatively distant from the periphery of the through space,
 wherein the annular inner seal and the annular outer seal are interposed between the chuck main body and the chuck base,
 wherein a gap is formed between the chuck main body and the chuck base, and
 wherein a heat transfer space for accommodating the heat transfer fluid is defined by the chuck main body, the chuck base, the annular inner seal, and the annular outer seal.

12. The electrostatic chuck of claim 1,
 wherein the insert has a cavity into which a power line is introduced.

13. The electrostatic chuck of claim 1,
 wherein the chuck base comprises at least any one of a heating element and a cooling element.

14. The electrostatic chuck of claim 1,
 wherein the heat transfer fluid is an inert gas.

15. The electrostatic chuck of claim 1, further comprising:
 an insulating member disposed under the lower surface of the chuck base, wherein the insert extends through the insulating member, and the upper end of the chuck pressing unit contacts a lower surface of the insulating member.

16. The electrostatic chuck of claim 1, further comprising:
 an auxiliary plate connecting the lower end of the insert to the lower end of the chuck pressing unit.

17. A substrate processing apparatus comprising:
 a process chamber having a substrate processing space; and
 an electrostatic chuck disposed in the substrate processing space,
 wherein the electrostatic chuck comprises:
 a chuck main body disposed at an upper side of the electrostatic chuck and configured to hold a substrate with an electrostatic force;
 a chuck base disposed at a lower side of the electrostatic chuck and configured to receive high-frequency power and adjust a temperature of the chuck main body;
 a heat transfer layer disposed between the chuck main body and the chuck base and configured to transfer heat between the chuck base and the chuck main body using a heat transfer fluid;
 an insert including an upper end which is connected to a lower surface of the chuck main body and extends downward; and
 a chuck pressing unit configured to maintain a state in which the heat transfer layer contacts each of the chuck main body and the chuck base,
 wherein the chuck base has a hole through which the insert passes,
 wherein the heat transfer layer has a through space through which the insert passes, and wherein an upper end of the chuck pressing unit is connected to a lower surface of the chuck base and a lower end of the chuck pressing unit is connected to a lower end of the insert and the chuck pressing unit is configured to apply a downward force to the lower end of the insert.

\* \* \* \* \*